(12) United States Patent
Shin et al.

(10) Patent No.: US 8,549,744 B2
(45) Date of Patent: Oct. 8, 2013

(54) PRINTED CIRCUIT BOARD USING BUMP AND METHOD FOR MANUFACTURING THEREOF

(75) Inventors: Hee-Bum Shin, Gunpo-si (KR); Dong-Jin Park, Suwon-si (KR); Jee-Soo Mok, Yongin-si (KR); Jong-Suk Bae, Busan (KR); Ki-Hwan Kim, Boryeong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1896 days.

(21) Appl. No.: 11/727,838

(22) Filed: Mar. 28, 2007

(65) Prior Publication Data

US 2007/0235220 A1 Oct. 11, 2007

(30) Foreign Application Priority Data

Apr. 11, 2006 (KR) ........................ 10-2006-0032635

(51) Int. Cl.
*H01K 3/10* (2006.01)

(52) U.S. Cl.
USPC ............................................. 29/852; 174/262

(58) Field of Classification Search
USPC ............................. 174/262–266; 29/846–853
See application file for complete search history.

(56) References Cited

U.S. PATENT DOCUMENTS

| | | | |
|---|---|---|---|
| 2002/0179334 A1* | 12/2002 | Curcio et al. | 174/264 |
| 2004/0182603 A1* | 9/2004 | Tseng et al. | 174/262 |

FOREIGN PATENT DOCUMENTS

| | | |
|---|---|---|
| JP | 9-181452 | 7/1997 |
| JP | 2001-168228 | 6/2001 |
| JP | 2002-9441 | 1/2002 |
| JP | 2003-60349 | 2/2003 |
| WO | 2004/093508 A1 | 10/2004 |
| WO | 2004/103039 A1 | 11/2004 |

OTHER PUBLICATIONS

Japanese Office Action issued Jan. 19, 2010 in corresponding Japanese Patent Application 2007-101687.

* cited by examiner

*Primary Examiner* — Jeremy C Norris

(57) ABSTRACT

The present invention provides a method for manufacturing a printed circuit board and a print circuit board manufactured thereby, in which through holes of a core board are filled by reverse pulse plating so that it allows to manufacture a core board having greater than 100 μm of a thickness which has been a processing limitation with conventional technologies and form bumps on a thick insulation layer, which has been difficult till now, and thus providing resistance against pressure of paste bumps produced during stacking due to the increased strength of a core board, convenience to join between layers, excellent heat-releasing effect, and collectively stacking of core boards, which was not possible with conventional methods.

9 Claims, 9 Drawing Sheets

PRINTED CIRCUIT BOARD USING BUMP AND METHOD FOR MANUFACTURING THEREOF

CROSS-REFERENCE TO RELATED APPLICATIONS

This application claims the benefit of Korean Patent Application No. 2006-32635 filed with the Korea Industrial Property Office on Apr. 11, 2006, the disclosure of which is incorporated herein by reference in their entirety.

BACKGROUND

1. Technical Field

The present invention relates to a printed circuit board using bumps and a manufacturing method thereof, and more particularly, to a printed circuit board formed by collectively stacking multilayer and a manufacturing method thereof.

2. Description of the Related Art

A conventional multilayer printed circuit board has been prepared by forming inner layer circuits on the surface of a core board, such as copper clad laminate (CCL), etc., through the application of an additive method or a subtractive method, and by forming outer layer circuits through stacking of insulation layers and metal layers in order, by the same method as for forming the inner layer circuit.

With developments in electronic components, there is a demand for technology which can improve the performance of HDI (high density interconnection) boards, to which the concepts of interlayer electrical connection and micro circuit wiring have been applied for higher density printed circuit boards. That is, to improve the performance of HDI boards, a technology is required which provides interlayer electrical connection and an adequate degree of freedom.

The method of manufacturing a multilayer printed circuit board according to conventional technologies includes first perforating through holes in a core board (e.g. a CCL, etc.) by mechanical drilling, etc., forming plating layers by chemical copper plating and/or copper electroplating, etc., on the surfaces of the core board and on the inner perimeters of the through holes, and then forming inner layer circuits on the surfaces of the core board by applying an additive or a subtractive process, etc., and inspecting the circuits.

Next, a build-up process is performed by procedures of surface treatment and stacking RCC (resin coated copper), etc., and through holes are formed for interlayer electrical connection between circuits by laser drilling, etc. and the surface of the through holes is plated, after which outer layer circuits are formed on the surface of the stacked board and the circuits are inspected. To add more layers of circuits, the process is repeated of surface treatment and stacking RCC, etc., forming through holes, plating the surfaces of the through holes, and afterwards forming outer layer circuits. Such a build-up process is repeated to form a desired number of circuit layers.

However, the conventional manufacturing process for multilayer printed circuit boards is unable to comply to requests for low costs according to lowering prices in the applied products (e.g. cell phones, etc.) and requests for reduced lead times for increased productivity, and thus there is a demand for a new manufacturing process that can resolve such problems.

In order to simplify the complicated process of related art and to manufacture a multilayer printed circuit quickly and inexpensively by a collective stacking procedure, the so-called "B2IT (buried bump interconnection technology)" has been commercialized, which allows a simple and convenient stacking process by printing paste on a copper foil 3 to form bumps 2' and stacking an insulation material 1 thereon to prefabricate a paste bump board, as illustrated in FIG. 1.

Related art to the paste bump board includes an invention which uses a paste bump board having bumps made of conductive paste formed on a copper foil to allow simple and easy interconnection between the terminals of high-density electronic components. This, however, implements all-layer IVH's with only the paste bump board so that it has a weak structure and there is also a limit to reducing thickness of the board to be used as an inner layer core board due to limitation of the processing of through holes. Also, there is a difficulty of guaranteeing an interlayer electrical connection and a degree of freedom to improve the performance of HDI or BGA boards and provide excellent heat-releasing effect.

SUMMARY

The present invention provides a method for manufacturing a printed circuit board and a print circuit board manufactured thereby, in which through holes of a core board are filled by reverse pulse plating so that it allows to manufacture a core board having greater than 100 μm of a thickness which has been a processing limitation with conventional technologies and form bumps on a thick insulation layer which has been difficult till now.

The present invention further provides a method for manufacturing a printed circuit board and a print circuit board manufactured thereby, which can resist against pressure of paste bumps produced during stacking due to the increased strength of a core board, be easy to join between layers, provide excellent heat-releasing effect, and be capable of collectively stacking of core boards, which was not possible with conventional methods.

The present invention further provides a method for manufacturing a printed circuit board and a print circuit board manufactured thereby, in which the manufacturing time can be reduced due to continuing work through parallel processes of plating and a process for forming window portions to form blind via holes can be omitted.

According to an embodiment of the present invention, it provides a method of manufacturing a printed circuit board using bumps, including: forming through hole(s) on a core board, filling the through hole(s) by fill-plating and forming a circuit on the surface of the core board, joining core bump(s) on at least one surface of the position(s) where the through hole(s) are formed, setting the core bump(s), stacking an insulation material on the at least one surface of the core board such that the core bump(s) penetrate the insulation material, stacking a conductive layer on the insulation material, and forming a circuit on the surface of the conductive layer, wherein the fill-plating may be reverse pulse plating.

Here, a process of collectively stacking at least one paste bump board on the circuit may be further included, wherein the at least one paste bump board may be formed by joining paste bumps on one surface of a copper foil, setting the paste bumps, and stacking a first insulation material on one surface of the copper foil such that the paste bumps penetrate the first insulation material.

In the process of stacking the insulation material on the at least one surface of the core board, the insulation material and the plating layer may form resin coated Cu foil (RCC).

Further, the fill-plating may be performed on the insulation material having a thickness of 100-400 μm included in the core board.

The fill-plating may be performed on parallel processes and according to an embodiment, the reverse pulse plating may be performed at 1-10 ASD of forward current density, 10-500 ms of forward time, 5-50 ASD of reverse current density, and 0.4-25 ms of reverse time.

According to another embodiment of the present invention, it provides a method of manufacturing a printed circuit board using bumps by collectively stacking at least one first core board and at least one second core board, in which the first core board is formed by forming through hole(s) on a core board, filling the through hole(s) by fill-plating, and forming a circuit on the surface of the core board; the second core board is formed by joining core bump(s) onto at least one surface of the position(s) where the through hole(s) are formed, setting the at core bump(s), and stacking a core insulation material on at least one surface of the core board such that the core bump(s) penetrate the core insulation material, in which the fill-plating may be reverse pulse plating.

Here, the printed circuit board may include at least one first board and at least one second board and the core bump(s) and the fill-plated through hole(s) or the circuit are arranged and stacked in correspondence with each other, and afterwards pressed.

The method may further include forming an outer board which is stacked on the extreme outer surface of the first core board or the extreme outer surface of the second core board, including joining outer bump(s) on a copper foil, setting the outer bump(s), and stacking an outer insulation material on the copper foil such that the outer bump(s) penetrate the outer insulation material.

Further, the printed circuit board may include at least one first board, at least one second board, and at least one outer board and the core bump(s) and the fill-plated through hole(s) or the circuit are arranged and stacked in correspondence with each other, and afterwards pressed.

The thickness of the insulation material included in the core board may be 100-400 µm.

The fill-plating may be performed on the parallel process and according to an embodiment, the reverse pulse plating may be performed at 1-10 ASD of forward current density, 10-500 ms of forward time, 5-50 ASD of reverse current density, and 0.4-25 ms of reverse time.

According to another embodiment of the present invention, it provides a printed circuit board using bumps, including: a core board, through hole(s) formed in the core board, a fill-plating layer filled in the through hole(s), a circuit formed on at least one surface of the core board, core bump(s) formed on the surface of the fill-playing layer, an insulation layer penetrating the core bump(s) and formed on at least one surface of the core board, and a conductive layer formed on the insulation layer, in which the fill-plating may be reverse pulse plating.

A thickness of the insulation material included in the core board may be 100-400 µm.

According to still another embodiment of the present invention, it provides a printed circuit board using bumps, including: at least one first board including a core board, through hole(s) in the core board, a fill-plating layer filled in the through hole(s), and a circuit formed on at least one surface of the core board; and at least on second board including core bump(s) formed on the surface of the fill-plating layer of the first core board and an insulation layer penetrating the core bump(s) and formed on at least one surface of the core board, in which the fill-plating may be a reverse pulse plating.

Here, the printed circuit board may include at least one outer board, which includes a copper foil, outer bump(s) joining to one surface of the copper foil, and an insulation layer penetrating the outer bump(s) and formed on the one surface of the copper foil and is stacked on the extreme outer layer of the printed circuit board.

Here, the at least one first board, the at least one second board, and the at least one outer board may form all-layer interstitial through holes (IVH).

A thickness of the insulation material included in the core board may be 100-400 µm.

Additional aspects and advantages of the present general inventive concept will be set forth in part in the description which follows, and in part will be obvious from the description, or may be learned by practice of the general inventive concept.

DETAILED DESCRIPTION

Embodiments of the printed circuit board using bumps and manufacturing method thereof, according to aspects of the invention, will be described below in more detail with reference to the accompanying drawings.

Figure 1:
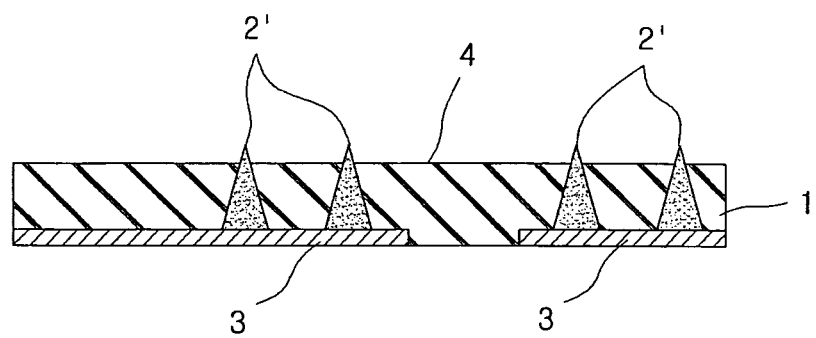
FIG. 1 is a cross-sectional view of a bump board according to related art.
Figure 2:
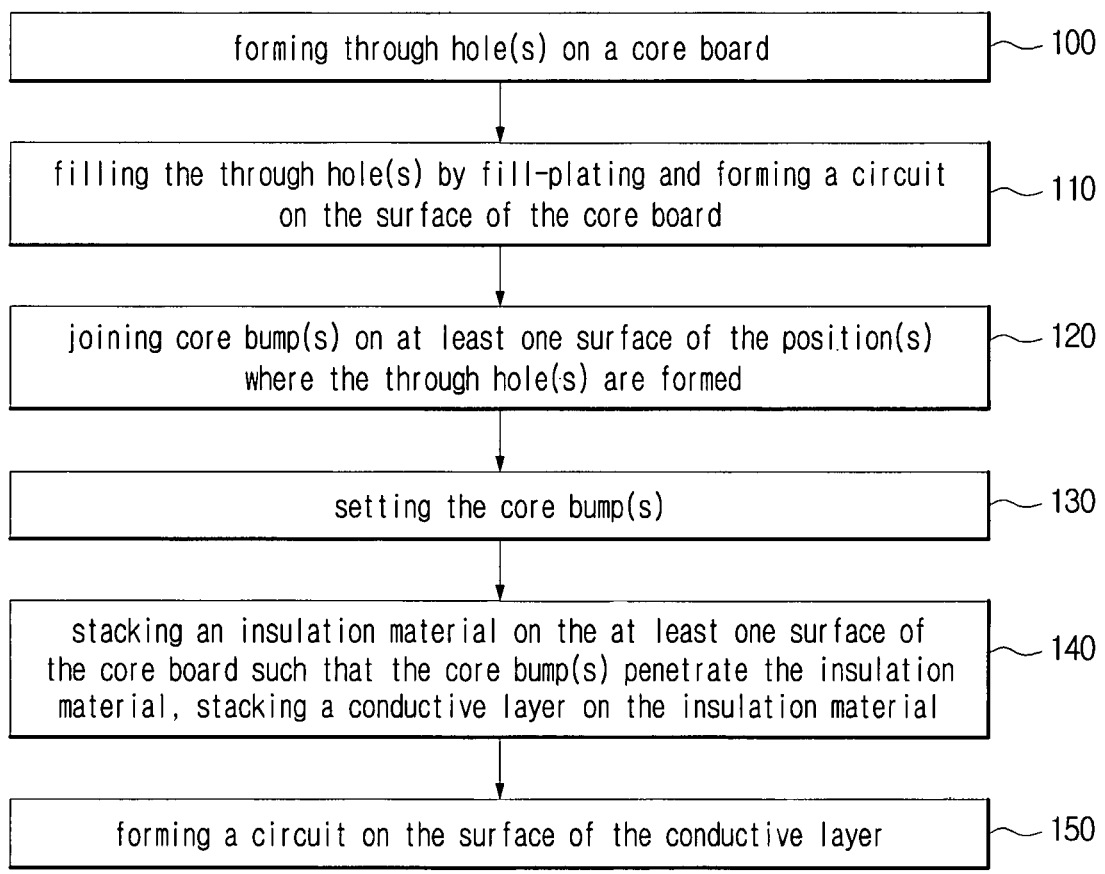
FIGS. 2 to 4 are flowcharts illustrating a method of manufacturing a printed circuit board using bumps according to embodiments of the present invention.

FIG. 2 is a flowchart illustrating a method of manufacturing a printed circuit board using bumps according to an embodiment of the present invention.

The present invention provides a core board which allows collectively manufacturing a multi-layer printed circuit board by forming through holes in the core board, filling the through holes by reverse pulse plating, printing core bumps in correspondence with the positions of the through holes, and stacking an insulation material. Accordingly, the printed circuit board may be formed, which allows forming a thick core board and forming bumps on the thick insulation layer, endures against pressure produced during the stacking process, is convenient for joining layers, exhibits excellent heat-releasing effect, allows collective stacking, reduces manufacture time through continuous processes, and simplifies the manufacture processes. To this end, first, through holes are formed in the core board (S100).

For the core board, it is generally efficient to use a copper clad laminate (CCL), which has a copper foil stacked on its surface, as it is effective in forming circuits. It is apparent that before forming through holes, any typical pretreatment process such as baking be performed. There are a variety of methods for forming through holes such as mechanical drilling and laser ($CO_2$ or YAG laser) drilling, however, it is not limited to them. Through holes are perforated by mechanical drilling in an embodiment of the invention due to convenient operation and processing readily the insulation layer having a thickness of greater than 100 µm. Further, when the through holes are processed by mechanical drilling, any additional process such as a process of removing a part of a copper foil and forming window portions for forming blind through holes may be omitted, so that the manufacture process may be simplified.

Next, the through holes are fill-plated and circuits are formed on the surface of the core board (S110), in which reverse pulse plating is used to fill the through holes in the present invention. The reverse pulse plating provides more advantageous than plating using DC current in that it prevents precipitation effect in a high current density, while it increases precipitation effect in a low current, resulting in a uniform plating layer, and it also improves uniform microthrowing power, resulting in more favorable for filling the through holes.

Further, when DC current is used for plating, there is a limitation on a thickness of a board and a thickness of the surface. For example, a thickness of a plated layer formed on the surface has to be unnecessary higher, resulting in more times and efforts to remove it when DC current is used for fill-plating through holes, and thus it is not desirable. Further, fill-plating cannot even possible if a thickness of an insulation layer of a core board is greater than 150 μm. On the other hand, the reverse pulse plating of the present invention may be performed not only to the insulation layer having a thickness of greater than 150 μm but also to the surface having about half thickness of the DC current-plated layer, to fill-plate the through holes. Thus, it has much wider ranges of board thicknesses. Further, any additional process such as a process to reduce a thickness of the copper foil formed on the surface of the core board to a particular thickness by a half etching process, which is required when DC plating is used, may be omitted.

In addition, the lead time is decreased, the productivity is increased, and the manufacture time is reduced due to parallel processes.

Next, the core bumps are printed on at least one surface of the positions where the through holes are formed (S120) and the printed core bumps are set (S130). The core bumps used in the present invention may be formed of paste bumps, particularly paste including metal particles such as silver, gold, palladium, copper, platinum, and the like is typically used. Among these, silver paste may be typically used as the material for the paste bumps since its conductivity is excellent. However, it is to be appreciated that other types of paste may be used, within a scope apparent to those skilled in the art, in consideration of the strength, cost, and applicability of the paste.

Next, an insulation material is stacked on at least one surface of the core board such that the core bumps penetrate the insulation material and the plating layer is stacked on the insulation material (S140). Then circuits are formed on the plating layer (S150). Here, the insulation material and the plating layer may be supplied collectively by resin coated Cu foil (RCC).

The strength of the core bumps printed and set on at least one surface of the fill-plated through holes may be lower than that of the plating layer of other boards and greater than that of the insulation material. Thus, when the insulation material is stacked on the core board on which the circuit wiring is formed, the core bumps are not deformed but instead penetrate the insulation material. Also, in order to prevent the damaging of the plating layer by the core bumps during the process of stacking and pressing the core bumps onto the other boards to electrically connect the core bumps and the plating layer of the other boards, it is desirable that the strength of the core bumps be lower than that of the plating layer on the other boards.

The printed circuit board formed by such processes may be used as a core board to collectively stack onto another paste bump board. For example, a paste bump board may be formed by joining paste bump(s) on a copper foil, setting the paste bumps, and stacking an insulation material on a copper foil such that the paste bumps penetrate the insulation material. A multi-layer printed circuit board may be formed by collectively stacking and pressing the paste bump board onto more than one of the upper part and the lower part of the core board.

The multi-layer printed circuit board of the present invention may be formed with one core board described above. It is apparent, however, that a multi-layer printed circuit board may also be formed by collectively stacking boards having a different structure as a core board.

Figure 3:
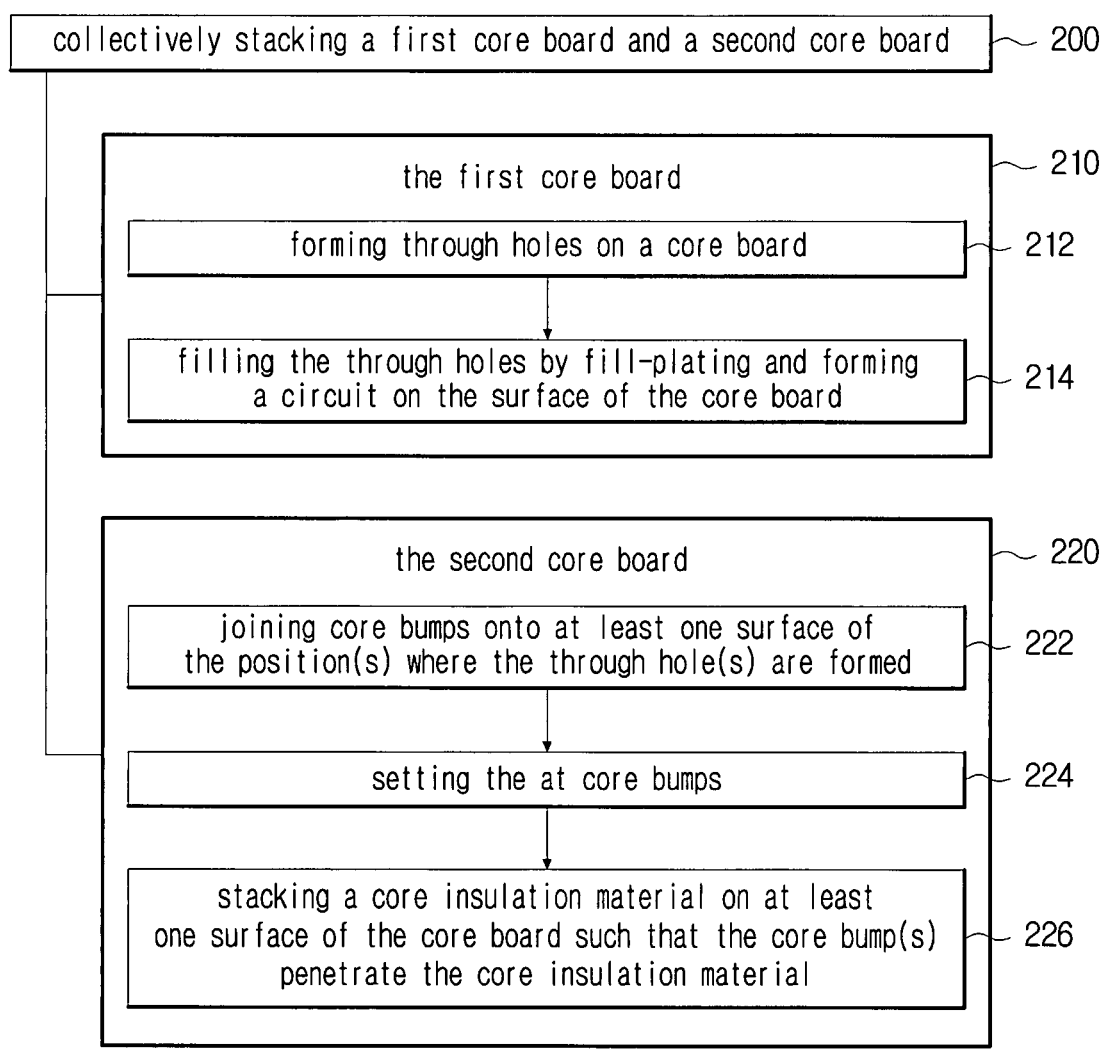

FIG. 3 is a flowchart illustrating a method of manufacturing a printed circuit board using bumps according to another embodiment of the present invention. In order to form a printed circuit board by collectively stacking a first board and a second board (S200), first, the first core board (S210) is formed by forming through holes on a core board (S212) and filling the through holes by fill-plating and forming circuits on the surface of the core board (S214).

Next, the second core board is formed (S220), which is for collectively stacking with the first core board to form a multilayer printed circuit board, by joining core bumps to a board in the same form as the first core board. That is, the second core board is formed by joining core bumps on at least one surface of the positions on the first core board where the through holes are formed (S222), setting the core bumps (S224), and stacking a core insulation material on at least one surface of the core board such that the core bumps penetrate the core insulation material (S226).

In the process of stacking the second core board on the first core board, the core bumps are electrically connected by joining with the plated through holes or the circuit formed on the first core board or the second core board. In other words, the first core board and the second core board are electrically connected to form IVH structure (interstitial through holes). The IVH structure formed according to the present invention is generally more stable, compared to that formed by stacking conventional paste bump boards, since the intermediate core boards and plating layers provide sufficient structural strength. Further, interlayer connections are more stable since a thickness of the core board is greater than that of conventional ones.

It is apparent that the multilayer printed circuit board be formed by including more than one first core board and more than one second core board. Compositions such as core boards, through holes, reverse pulse plating as fill-plating, and core bumps are the same as described in FIG. 2.

Figure 4:
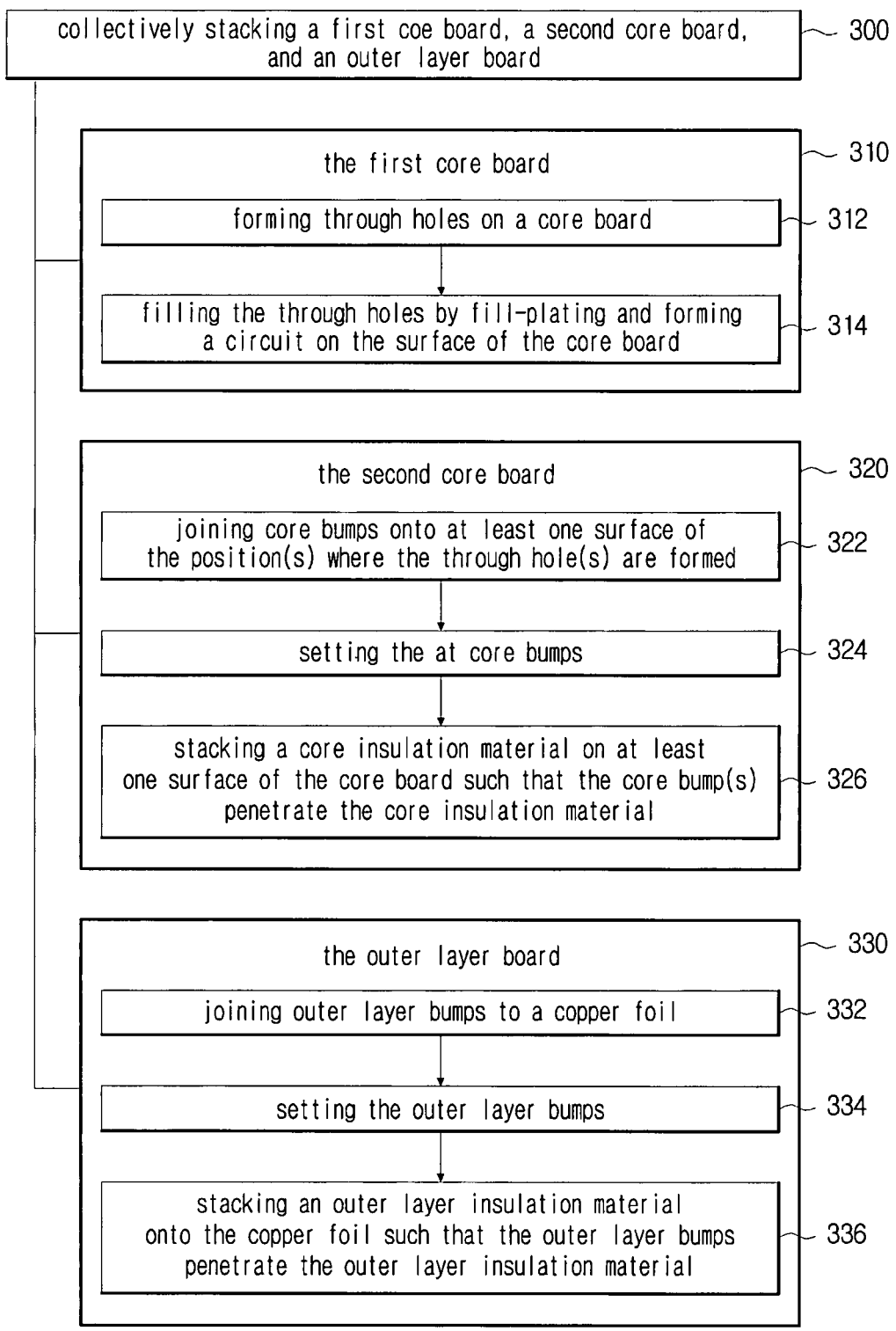

FIG. 4 is a flowchart illustrating a method of manufacturing a printed circuit board using bumps according to another embodiment of the present invention. Referring to FIG. 4, first, a fist core board (S310) and a second core board (S320) are formed as described in FIG. 2 and then, an outer layer board (S330) is formed by joining outer layer bumps onto a copper foil (S332), setting the outer layer bumps (S334), and stacking an outer layer insulation material onto the copper foil such that the outer layer bumps penetrate the outer layer insulation material (S336).

In the process of stacking the first core board, the second core board, and the outer layer board, the core bumps of the second core board are joined with the fill-plated through holes or the circuits formed on the first core board or the second core board and the outer layer bumps are joined with the fill-plated through holes or the circuits formed on the first core board or the second core board, so that each board is stacked and pressed collectively to be connected electrically. Here, it is apparent that a multilayer printed circuit board may be formed by including more than one of each of the first core board, the second core board, and the outer layer board. Further, compositions such as core boards, through holes, reverse pulse plating as fill-plating, and core bumps are the same as described in FIG. 2.

The composition of the core bumps, the paste bumps, and the outer layer bumps used in the present invention may be same or different, but since they are formed of a typical conductive paste, it may be same. The composition of the first insulation material included in the core insulation material, the outer layer insulation material, and the paste bump board may be same or different, but it is composed of typical insulation materials such as prepreg or resin layer. For forming circuits or circuit wiring in the present invention, any process such as etching may be used, within a scope apparent to those skilled in the art, and is not necessarily limited.

Figure 5:
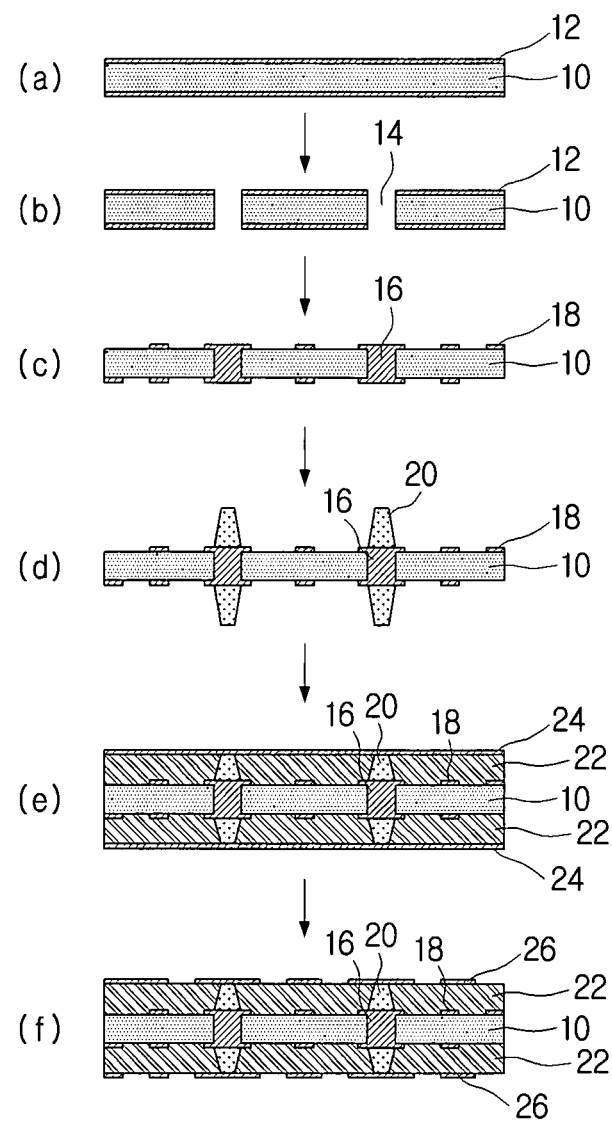
FIGS. 5 to 7 are flow diagrams illustrating a process of manufacturing a printed circuit board using bumps according to embodiments of the present invention.

FIG. 5 is a flow diagram illustrating a process of manufacturing a printed circuit board using bumps according to an embodiment of the present invention. In FIG. 5 are illustrated a core board 10, a conductive layer 12, through hole(s) 14, a plating layer 16, circuits or circuit(s) 18, 26, core bump(s) 20, and an insulation material 22.

As illustrated in FIG. 5, the multilayer printed circuit board according to the present embodiment is formed by forming through holes in the core board, fill-plating the through holes, forming the core bumps on the both sides of the fill-plated through holes, and stacking the insulation material and the conductive layer. Hereinafter the descriptions are provided in more detail.

To manufacture the core board having core bumps, the core board 10 included the conductive layer 12 such as a copper clad laminate (CCL), etc., is prepared as in (s) of FIG. 5, to which a pretreatment such as baking, etc., has been applied, and the through holes 14 are formed by drilling as in (b) of FIG. 5. As in (c) of FIG. 5, the through holes 14 are filled by fill-plating and a circuit forming process, including exposing, developing, etching, and inspecting, is applied to the fill-plating layer and the conductive layer 12 to form circuits 18. Here, a circuit wiring forming process may be performed within a scope apparent to those skilled in the art but according to an embodiment of the invention, fill-plating may be reverse pulse plating and the reverse pulse plating is performed the following conditions:

forward current density: 1-10 ASD
    reverse current density: 5-50 ASD
    forward time: 10-50 ms
    reverse time: 0.4-25 ms Plating is performed the following conditions:

Cu: 50-70 g/l
    $H_2SO_4$: 60-100 g/l
    Cl: 40-60 mg/l
    brightener: 10-30 mg/l
    leveler: 20-40 mg/l
    $Fe^{3+}$: 1-7 g/l When forward current density is lower then 1 ASD, it is not desired since plating is not occurred. On the other hand, when it is greater than 10 ASD, it requires an additional post-treatment process since plating particles become rough and the plated surface is deteriorated and conductivity is also deteriorated since the inner part of the holes becomes also rough and particles become uneven. The reverse current density is determined according to the forward current density and a threshold value of a rectifier and related to the reverse time. Such a reverse current density may be obtained by a tester. For example, when the reverse time is 0, it is identical to a conventional DC current plating.

The manufacturing time is reduced and productivity is improved due to parallel processes of the reverse pulse plating. According to an embodiment of the present invention, an apparatus from Atotech Inc. is used for plating under the above-described conditions.

As in (d) of FIG. 5, a conductive paste such as silver paste is printed on at least on surface of the fill-plating layer 16 to form the core bumps 20. As in (e) of FIG. 5, the insulation material 22 such as prepreg, etc., is stacked onto the core board 10 on which the circuits 18 are formed and the conductive layer 24 is further stacked on the insulation material 22. According to an present embodiment, a resin coated copper (RCC) including an insulation layer and a conductive layer may be stacked to form the core bumps 20 inside the insulation layer 22 and the lower side of the conductive layer 24 by a single process. A printed circuit board is manufactured by forming circuits 26 on the conductive layer as in (f) of FIG. 5.

Figure 6:
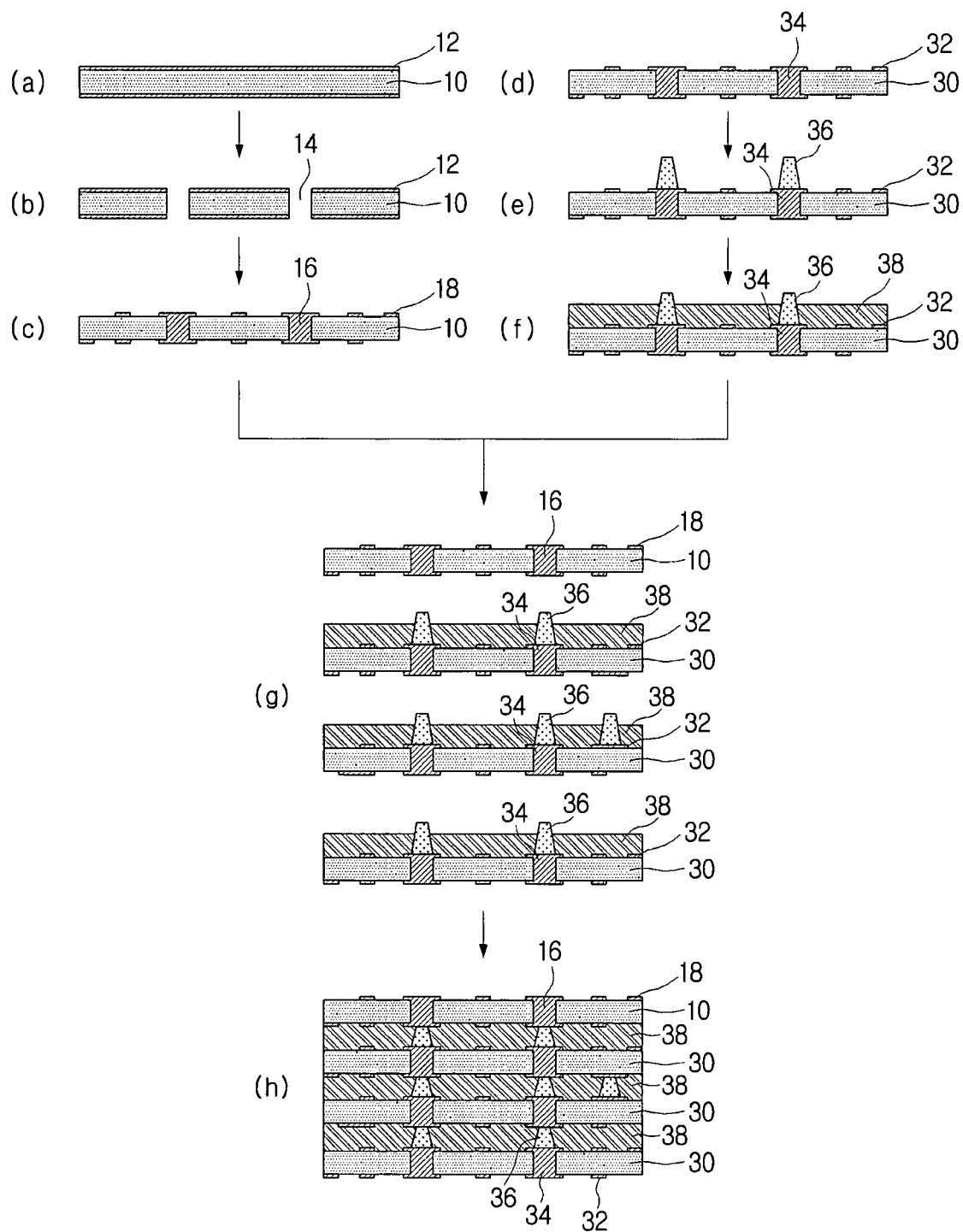

FIG. 6 is a flow diagram illustrating a process of manufacturing a printed circuit board using bumps according to another embodiment of the present invention. In FIG. 6 are illustrated a core board 10, 30, a conductive layer 12, through hole(s) 14, a plating layer 16, 34, circuits or circuit(s) 18, 32, core bump(s) 20, and an insulation material 38.

As illustrated in FIG. 6, a multilayer printed circuit board is formed by preparing a first core board side by side with a second core board and collectively stacking these two core board. Each unit process is described in detail hereinafter.

Figure 7:
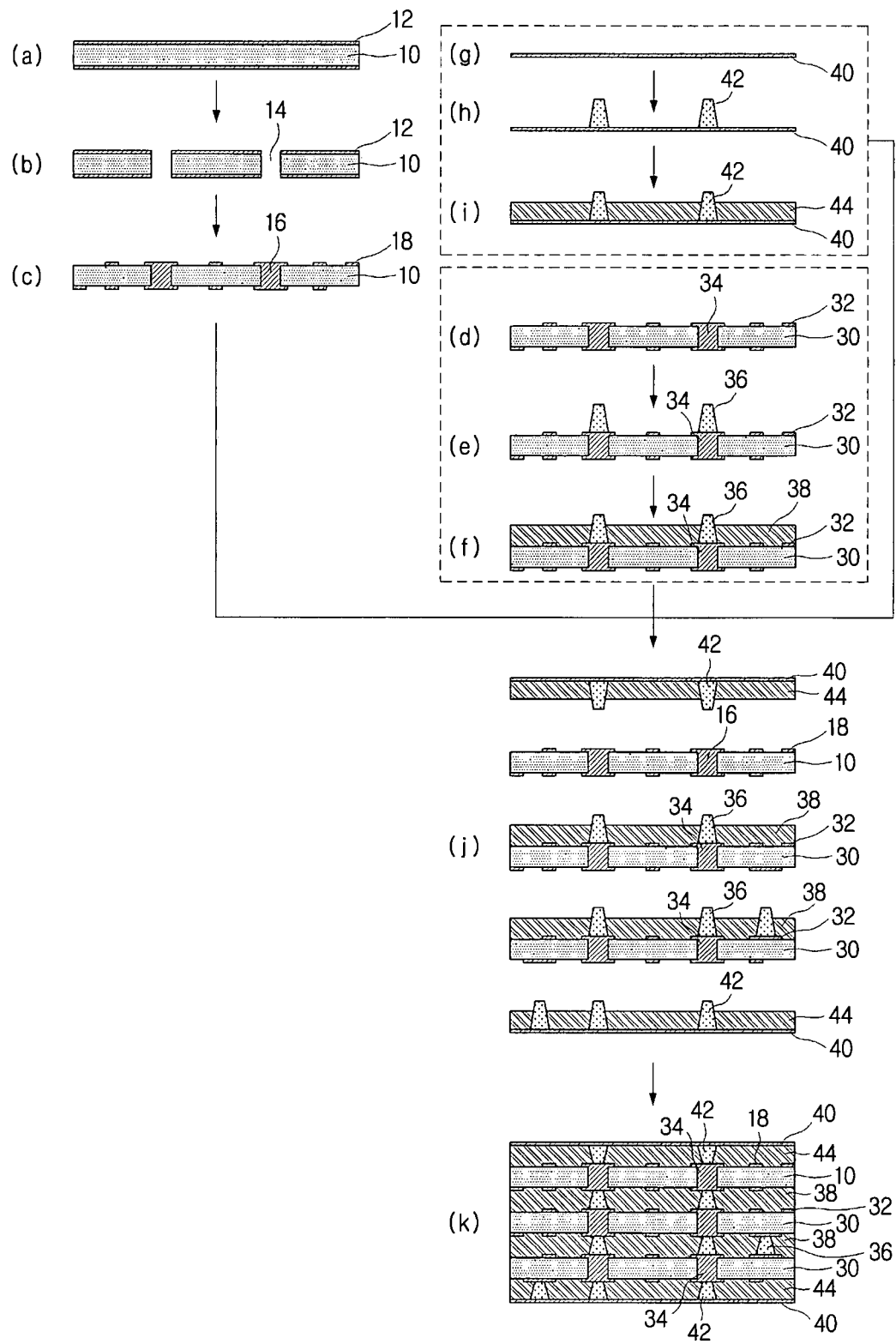

FIG. 7 is a flow diagram illustrating a process of manufacturing a printed circuit board using bumps according to another embodiment of the present invention. In FIG. 7 are illustrated core boards 10, 30, conductive layers 12, through hole(s) 14, plating layers 16, 34, circuits or circuit(s) 18, 32, core bump(s) 36, insulation materials 38, 44, copper foil 40, and outer layer bumps 42.

As illustrated in FIG. 7, a multilayer printed circuit board is formed by preparing a first core board, a second core board, and an outer layer board each and collectively stacking them. Each unit process is described in detail hereinafter.

(1) Manufacturing Process for the First Core Board

To manufacture a first core board, which does not have paste bumps, a core board 10 including the conductive layer 12, such as a copper clad laminate (CCL), etc., is prepared as in (a) of FIG. 7, to which pre-processing procedures such as baking, etc., have been applied. Then, as in (b) of FIG. 7, the through holes are formed by drilling. As in (c) of FIG. 7, the through holes are fill-plated in which the fill-plating is reverse pulse plating in the present invention. Since the detail description was provided in FIG. 5, redundant explanation is omitted.

As in (c) of FIG. 7, the circuit forming process, including exposing, developing, etching, and inspecting, is applied to the conductive layer 12 to form circuits 18 and the resulting board is transported for a lay-up process which will be described later.

(2) Manufacturing Process for the Second Core Board

As in (d) of FIG. 7, the second core board manufactured by the manufacturing process for the first core board is prepared, and as in (e) of FIG. 7, the core bumps 36 are printed on one surface of the through holes 34 plated with conductive paste such as silver paste. The core bumps 36 to be joined to the second core board are electrically connected with plated through holes of another core board or with circuits, while the through holes 34 of the second core board are joined with another core board or outer layer bumps of the outer layer board.

In order to collectively perform processes the insulation layer 38, such as prepreg, etc., is stacked on one surface of the core board 30 on which the circuits are formed as in (f) of FIG. 7. During this process, the core bumps 36 penetrate the insulation layer such as prepreg, etc., to protrude out to the surface of the insulation material 38.

By thus having the core bumps 36 exposed through the surface of the insulation material 38, joining to a plating layer of another board or circuits can be more stable during the collective stacking process. When the process of stacking the insulation material 38 is completed, the resulting board is transported for a lay-up process, which will be described later.

(3) Manufacturing Process for the Outer Layer Board

The outer layer bumps 42 are formed by printing conductive paste such as silver paste, etc., as in (h) of FIG. 7 to the copper foil 40 as in (g) of FIG. 7. As described in the manufacturing process of the second core board, the insulation material 44 such as prepreg, etc., is stacked to the copper foil 40 in order to improve efficiency of collective stacking as in (i) of FIG. 7. During this process, the outer layer bumps 42 formed onto the copper foil 40 penetrate the outer layer insulation material 44 such as prepreg, etc., to protrude out to the surface of the outer layer insulation material 44.

(4) Lay-Up and Collective Stacking Process

As in (j) of FIG. 7, a lay-up process is performed for the first core board, second core boards, and outer layer boards, such that the positions of the core bumps 36 and the outer layer bumps 42 are aligned with the positions of the fill-plating layer 16, and the boards collectively stacked as in (k) of FIG. 7 are pressed together to manufacture the multilayer printed circuit board. A conventional build-up process of prior art may be applied to the ensuing process of forming outer layer circuits on the printed circuit board.

As illustrated in (j) and (k) of FIG. 7, several first core boards or second core boards may be stacked to obtain a required number of circuit layers.

Figure 8:
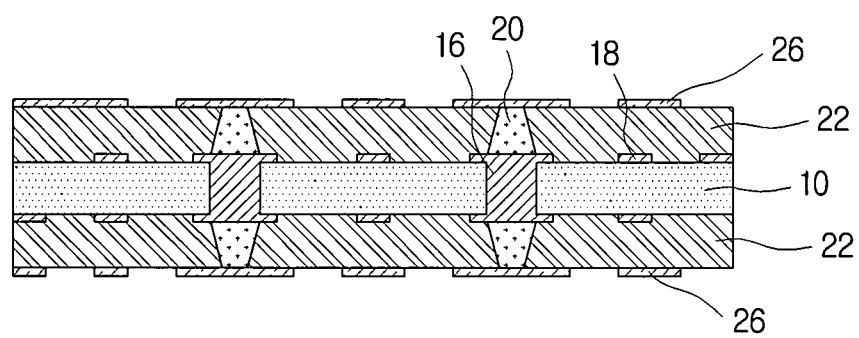
FIGS. 8 and 9 are cross-sectional views illustrating a printed circuit board using bumps according to embodiments of the present invention.

FIG. 8 is a cross-sectional view of a printed circuit board using bumps manufactured according to the manufacturing process of the printed circuit board as illustrated in FIG. 5. In FIG. 8 are illustrated core boards 10, fill-plating layers 16, circuits 18, 26, core bumps 20, and insulation materials 22.

The printed circuit board according to an embodiment of the present invention is formed by forming through holes in the core board 10, forming fill-plating layers 16 therein, forming core bumps 20 on the both surfaces of the fill-plating layers 16, stacking the insulation layers 22 on the both surfaces of the core boards 10 on which the circuits 18 are formed, and forming outer circuits 26.

Figure 9:
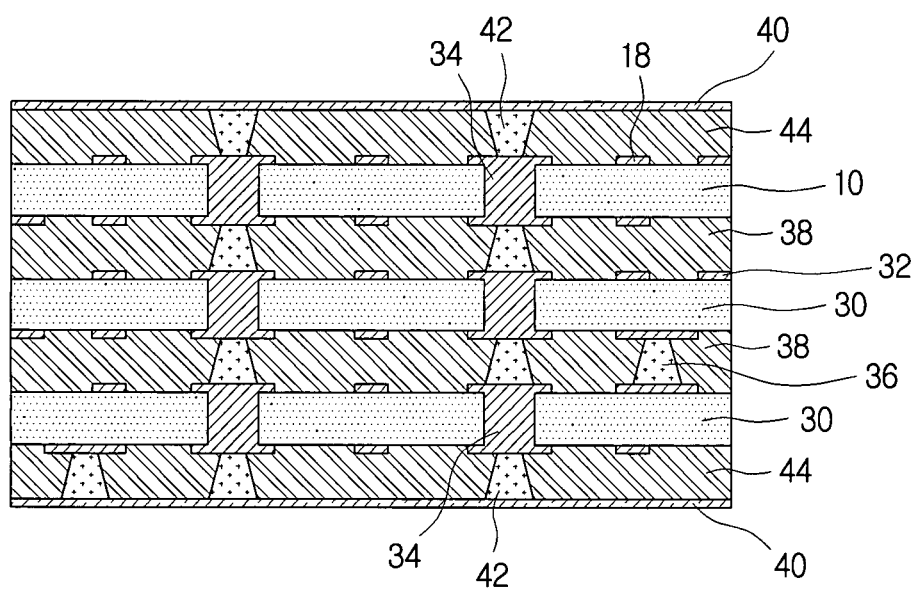

FIG. 9 is a cross-sectional view of a printed circuit board using bumps manufactured according to the manufacturing process of the printed circuit board as illustrated in FIG. 7. In FIG. 9 are illustrated core boards 10, 30, fill-plating layers 34, circuits 18, 32, core bumps 36, insulation materials 38, 44, copper foils 40, and outer layer bumps 42.

The printed circuit board according to an embodiment of the present invention is formed by forming through holes in the core board, forming fill-plating layers 34 therein, forming core bumps 36 on the fill-plating layers 34, collectively stacking board stacked with the insulation layers 38 and outer layer boards to electrically connect the fill-plating layers 34, the core bumps 36, and the outer layer bumps 42, resulting in forming a stable IVH structure. Here, in the outer layer board are formed the outer layer bumps 42 and the outer layer insulation materials 44 on the copper foils 40.

According to an embodiment of the invention, the fill-plating layers 34 and the core bumps 36 are electrically connected by forming through holes in the core board, forming boards having fill-plating layers 34 inside the through holes, forming core bumps 36 on the fill-plating layers 34 of the boards, and collectively stacking the board stacked with the insulation layer 38. Here, the extreme outer layer includes the circuits 18 formed on the core boards 10, 30. Thus, the fill-plating layers 34 and the core bumps 36 are electrically connected to form a more stable all-layer IVH structure.

A thickness of the insulation material included in the core boards 10, 30 of the printed circuit board according to the present invention may be 100-400 μm. The reverse pulse plating may be performed to fill the through holes.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a printed circuit board using bumps, comprising:
   forming a through hole on a core board;
   filling the through hole by fill-plating and forming a circuit on the surface of the core board;
   joining a core bump on at least one surface of the position where the through hole is formed;
   setting the core bump;
   stacking an insulation material on the at least one surface of the core board such that the core bump penetrates the insulation material and stacking a conductive layer on the insulation material; and
   forming a circuit on the surface of the conductive layer,
   wherein the fill-plating is reverse pulse plating, and is performed on the insulation material having a thickness of 100-400 μm, included in the core board, and is performed at 1-10ASD of forward current density, 10-500 ms of forward time, 5-50 ASD of reverse current density, and 0.4-25 ms of reverse time.

2. The method of claim 1, further comprising collectively stacking one or more paste bump boards on the circuit, wherein the paste bump board is formed by:
   joining paste bumps on one surface of a copper foil;
   setting the paste bumps; and
   stacking a first insulation material on one surface of the copper foil such that the paste bumps penetrate the first insulation material.

3. The method of claim 1, wherein in the process for stacking an insulation material on the at least one surface of the core board and stacking a conductive layer on the insulation material, the insulation material and the conductive layer are supplied by resin coated foil (RCC).

4. The method of claim 1, wherein the fill-plating is performed on parallel processes.

5. A method of manufacturing a printed circuit board using bumps by collectively stacking a first core board and a second core board, wherein
   the first core board is formed by:
      forming a through hole on a core board; and
      filling the through hole by fill-plating and forming a circuit on the surface of the core board,
   the second core board is formed by:
      joining a core bump onto at least one surface of the position(s) where the through hole is formed;
      setting the core bump; and
      stacking a core insulation material on at least one surface of the core board such that the core bump penetrates the core insulation material, wherein the fill-plating is reverse pulse plating, and is performed on the insulation material having a thickness of 100-400 μm, included in the core board, and is performed at 1-10 ASD of forward current density, 10-500 ms of forward time, 5-50 ASD of reverse current density, and 0.4-25 ms of reverse time.

6. The method of claim 5, wherein the printed circuit board comprises at least one first core board and at least one second core board and the core bumps and fill-plated through holes or the circuit are arranged and stacked in correspondence with each other and afterwards pressed.

7. The method of claim 5, further comprising forming an outer board,
wherein the outer board is formed by:
joining an outer bump on a copper foil;
setting the outer bump; and
stacking an outer insulation material on the copper foil such that the outer bump penetrates the outer insulation material,
wherein the outer board is stacked on the extreme outer surface of the first core board or the extreme outer surface of the second core board.

8. The method of claim 7, wherein the printed circuit board comprises the at least one first board, the at least one second board, and the at least one outer board;
the core bump and the fill-plated through hole or the circuit is arranged in correspondence with each other;
the outer bump and the fill-plated through hole or the circuit is arranged and stacked in correspondence with each other; and
pressed.

9. The method of claim 5, wherein the fill-plating is performed on the parallel processes.

* * * * *

UNITED STATES PATENT AND TRADEMARK OFFICE
CERTIFICATE OF CORRECTION

PATENT NO. : 8,549,744 B2
APPLICATION NO. : 11/727838
DATED : October 8, 2013
INVENTOR(S) : Hee-Bum Shin et al.

Page 1 of 1

It is certified that error appears in the above-identified patent and that said Letters Patent is hereby corrected as shown below:

In the Claims
In Column 11, Line 9 (Approx.), In Claim 6, delete "and the" and insert -- and --, therefor.

Signed and Sealed this
Eighteenth Day of February, 2014

Michelle K. Lee
*Deputy Director of the United States Patent and Trademark Office*